(12) United States Patent
Braun et al.

(10) Patent No.: US 8,174,301 B2
(45) Date of Patent: May 8, 2012

(54) PHASE-ERROR REDUCTION CIRCUITRY FOR AN IQ GENERATOR

(75) Inventors: Robert Braun, Bensheim (DE); Bardo Muller, Leibnitz (AT)

(73) Assignee: Fujitsu Semiconductor Limited, Yokohama (JP)

( * ) Notice: Subject to any disclaimer, the term of this patent is extended or adjusted under 35 U.S.C. 154(b) by 816 days.

(21) Appl. No.: 12/269,491

(22) Filed: Nov. 12, 2008

(65) Prior Publication Data

US 2009/0135968 A1 May 28, 2009

(30) Foreign Application Priority Data

Nov. 13, 2007 (EP) .................................... 07120612

(51) Int. Cl.
*H03K 3/00* (2006.01)
(52) U.S. Cl. ........................................ 327/291; 327/296
(58) Field of Classification Search .................. 327/113, 327/115, 117–118, 291, 295–296
See application file for complete search history.

(56) References Cited

U.S. PATENT DOCUMENTS

| | | | |
|---|---|---|---|
| 5,930,689 A | 7/1999 | Wilhite et al. | |
| 6,016,422 A | 1/2000 | Bartusiak | |
| 6,055,286 A * | 4/2000 | Wu et al. | 375/375 |
| 6,078,200 A | 6/2000 | Miyano | |
| 6,253,066 B1 * | 6/2001 | Wilhite et al. | 455/108 |
| 7,310,387 B2 * | 12/2007 | Kim et al. | 375/316 |
| 7,593,454 B2 * | 9/2009 | Rasmussen | 375/150 |
| 7,825,701 B2 * | 11/2010 | Kobata et al. | 327/105 |
| 2010/0134154 A1 * | 6/2010 | He | 327/115 |

FOREIGN PATENT DOCUMENTS

| | | |
|---|---|---|
| DE | 199 26 358 C1 | 3/2001 |
| EP | 0 308 071 A2 | 3/1989 |

* cited by examiner

*Primary Examiner* — An Luu
(74) *Attorney, Agent, or Firm* — Arent Fox LLP

(57) ABSTRACT

Phase-error-reduction circuitry for an IQ generator, wherein the phase-error-reduction circuitry is arranged to receive I and Q input signals from the IQ generator and to produce I and Q output signals, and wherein the phase-error-reduction circuitry is arranged to sample the I and Q input signals to tend to reduce a phase error between the I and Q output signals.

18 Claims, 17 Drawing Sheets

PHASE-ERROR REDUCTION CIRCUITRY FOR AN IQ GENERATOR

The invention relates to phase-error-reduction circuitry for an IQ generator and to a phase-controlled IQ generator.

BACKGROUND

The purpose of an IQ generator is to generate 90° phase-shifted signals I and Q.

FIG. 1 shows an IQ generator 10 including a master flip-flop DFF1 and a slave flip-flop DFF2. A clock signal DCLK is fed to a non-inverting clock input CLK of the master flip-flop DFF1 and to an inverting clock input XCLK of the slave flip-flop DFF2. A non-inverted output Q of the master flip-flop DFF1 is fed to a non-inverting input D of the slave flip-flop DFF2. An inverted output XQ of the slave flip-flop DFF2 is fed back to a non-inverting input D of the master flip-flop DFF1. The non-inverted output Q of the master flip-flop DFF1 produces an I signal and a non-inverted output Q of the slave flip-flop DFF2 produces a Q signal, which lags the I signal by approximately 90°. Owing for example to signal path mismatches in the circuit, the phase lag may not be exactly 90°.

SUMMARY

According to a first aspect, there is provided phase-error-reduction circuitry for an IQ generator, wherein the phase-error-reduction circuitry is arranged to receive I and Q input signals from the IQ generator and to produce I and Q output signals, and wherein the phase-error-reduction circuitry is arranged to sample the I and Q input signals to tend to reduce a phase error between the I and Q output signals.

In one embodiment, the phase-error-reduction circuitry is arranged to sample the I and Q input signals and reduce the phase error between the I and Q output signals. In another embodiment, the phase-error-reduction circuitry is arranged to sample the I and Q input signals so as to reduce a phase error between the I and Q output signals. In another embodiment, the phase-error-reduction circuitry is arranged to sample the I and Q input signals to tend to synchronise the I and Q output signals. In another embodiment, the phase-error-reduction circuitry is arranged to sample the I and Q input signals and synchronise the I and Q output signals. In another embodiment, the phase-error-reduction circuitry is arranged to sample the I and Q input signals so as to synchronise the I and Q output signals.

The phase-error-reduction circuitry may comprise first and second sampling circuitry portions arranged to receive the respective I and Q input signals and to produce the respective I and Q output signals, wherein the first and second sampling circuitry portions are arranged to sample the respective I and Q input signals according to a sampling clock signal, the sampling clock signal being independent of an IQ generator clock signal of the IQ generator.

The IQ generator clock signal may be derived from the sampling clock signal, for example by inputting the sampling clock signal to a divider and obtaining the IQ generator clock signal from the output of the divider. In a variant, the sampling clock signal may be derived from the IQ generator clock signal, for example by using a phase locked loop or a clock multiplier. In any case, both the sampling clock signal and the IQ generator clock signal should have a duty cycle which is as close to 50/50 as possible.

The phase-error-reduction circuitry may be arranged to adjust a frequency at which the I and Q input signals are sampled in response to a level of a sampling frequency selection signal.

The phase-error-reduction circuitry may be arranged to sample the I and Q input signals at a frequency which is an even multiple of an IQ generator clock signal in response to the sampling frequency selection signal being at a first level and to sample the I and Q input signals at a frequency which is an odd multiple of the IQ generator clock signal in response to the sampling frequency selection signal being at a second level.

Such an arrangement may be used in conjunction with a voltage-controlled oscillator to generate the sampling clock signal and, depending on the required frequency, a fixed ratio divider or a programmable divider with odd or even ratios to derive the IQ generator clock signal from the sampling clock signal.

The phase-error-reduction circuitry may comprise a polarity-control cell arranged to receive the sampling clock signal and having its output connected to a clock input of one of the first and second sampling circuitry portions, the polarity-control cell being arranged to feed an inverted or a non-inverted version of the sampling clock signal to the clock input of the respective sampling circuitry portion according to a level of a sampling frequency selection signal.

The phase-error-reduction circuitry may comprise a further polarity-control cell arranged to receive the sampling clock signal and having its output connected to a clock input of the other of the first and second sampling circuitry portions, the further polarity-control cell being arranged to feed an inverted version of the sampling clock signal to the clock input of the respective sampling circuitry portion.

The first and second sampling circuitry portions may be arranged to sample the I and Q input signals on one of a rising edge and a falling edge of the sampling clock signal.

One of the first and second sampling circuitry portions may be arranged to sample the respective I or Q input signal on a rising edge of the sampling clock signal and the other of the first and second sampling circuitry portions is arranged to sample the respective I or Q input signal on a falling edge of the sampling clock signal.

A frequency of a sampling clock signal may be at least four times higher than a frequency of the I and Q output signals.

According to a second aspect, there is provided a phase-controlled IQ generator arranged to output I and Q signals and comprising phase control circuitry arranged to switch the phase relationship of the I and Q signals between the I signal leading the Q signal and the I signal lagging the Q signal in response to a phase relationship selection signal.

The ability to control the phase relationship of the I and Q signals in this manner may provide for the selection of the upper and lower sideband in the conversion of the RF signals.

The phase control circuitry may comprise at least one polarity-control cell arranged to output an inverted or a non-inverted version of its input signal according to a level of the phase relationship selection signal.

The phase-controlled IQ generator may comprise a master latch circuitry portion and a slave latch circuitry portion, wherein the phase control circuitry is arranged to invert or not to invert inputs to the master and slave latch circuitry portions according to a level of the phase relationship selection signal.

The phase-controlled IQ generator may comprise a master latch circuitry portion, a slave latch circuitry portion and first and second polarity-control cells, the master latch circuitry portion being arranged to receive an IQ generator clock signal at its non-inverting clock input and the slave latch circuitry portion being arranged to receive the IQ generator clock signal at its inverting clock input, the master latch circuitry portion being arranged to receive at a non-inverting input a signal from the inverted output of the slave latch circuitry portion via the first polarity-control cell, and the slave latch circuitry portion being arranged to receive at a non-inverting input a signal from the non-inverted output of the master latch circuitry portion via the second polarity-control cell, wherein each of the first and second polarity control cells is arranged to receive the phase relationship selection signal and to output an inverted or a non-inverted version of its input signal according to a level of the phase relationship selection signal.

The phase-controlled IQ generator of the second aspect may be connected to the phase-error-reduction circuitry of the first aspect such that the I and Q signals output by the phase-controlled IQ generator are received by the phase-error-reduction circuitry as the I and Q input signals.

In the phase-error-reduction circuitry of the first aspect, the IQ generator may comprise the phase-controlled IQ generator of the second aspect.

According to a third aspect, there is provided a phase-controlled IQ generator arranged to output I and Q signals and comprising phase control circuitry arranged to switch the phase relationship of the I and Q signals between the I signal leading the Q signal and the I signal lagging the Q signal in response to a phase relationship selection signal, wherein the phase-controlled IQ generator is connected to phase-error-reduction circuitry arranged to receive the I and Q signals from the phase-controlled IQ generator as I and Q input signals and to produce I and Q output signals, and wherein the phase-error-reduction circuitry is arranged to sample the I and Q input signals to tend to reduce a phase error between the I and Q output signals.

According to a fourth aspect, there is provided a method of reducing a phase error between I and Q signals from an IQ generator, the method comprising receiving I and Q input signals from the IQ generator and producing I and Q output signals, and wherein producing the I and Q output signals comprises sampling the I and Q input signals to tend to reduce a phase error between the I and Q output signals.

According to a fifth aspect, there is provided a method of operating a phase-controlled IQ generator comprising outputting I and Q signals and switching the phase relationship of the I and Q signals between the I signal leading the Q signal and the I signal lagging the Q signal in response to a phase relationship selection signal.

According to a sixth aspect, there is provided means for reducing a phase error between I and Q signals from an IQ generator, wherein the means for reducing a phase error is arranged to receive I and Q input signals from the IQ generator and to produce I and Q output signals, and wherein the means for reducing a phase error is arranged to sample the I and Q input signals to tend to reduce a phase error between the I and Q output signals.

According to a seventh aspect, there is provided means for outputting I and Q signals comprising means for controlling a phase relationship arranged to switch the phase relationship of the I and Q signals between the I signal leading the Q signal and the I signal lagging the Q signal in response to a phase relationship selection signal.

According to a eighth aspect, there is provided a method of reducing a phase error between I and Q signals from an IQ generator, the method comprising the steps of receiving I and Q input signals from the IQ generator and producing I and Q output signals, and wherein the step of producing the I and Q output signals comprises the step of sampling the I and Q input signals to tend to reduce a phase error between the I and Q output signals.

According to a ninth aspect, there is provided a method of operating a phase-controlled IQ generator comprising the steps of outputting I and Q signals and switching the phase relationship of the I and Q signals between the I signal leading the Q signal and the I signal lagging the Q signal in response to a phase relationship selection signal.

The present invention includes one or more aspects, embodiments or features in isolation or in various combinations whether or not specifically stated (including claimed) in that combination or in isolation.

The above summary is intended to be merely exemplary and non-limiting.

BRIEF DESCRIPTION OF THE DRAWINGS

A description is now given, by way of example only, with reference to the accompanying drawings, in which:—

DETAILED DESCRIPTION

Throughout the following description, where a signal is fed to one of an inverting input and a non-inverting input, the complement of the signal is fed to the other of the inverting input and the non-inverting input. Reference may be made to only one of the signals. It should be understood that such an arrangement is optional.

Figure 1:
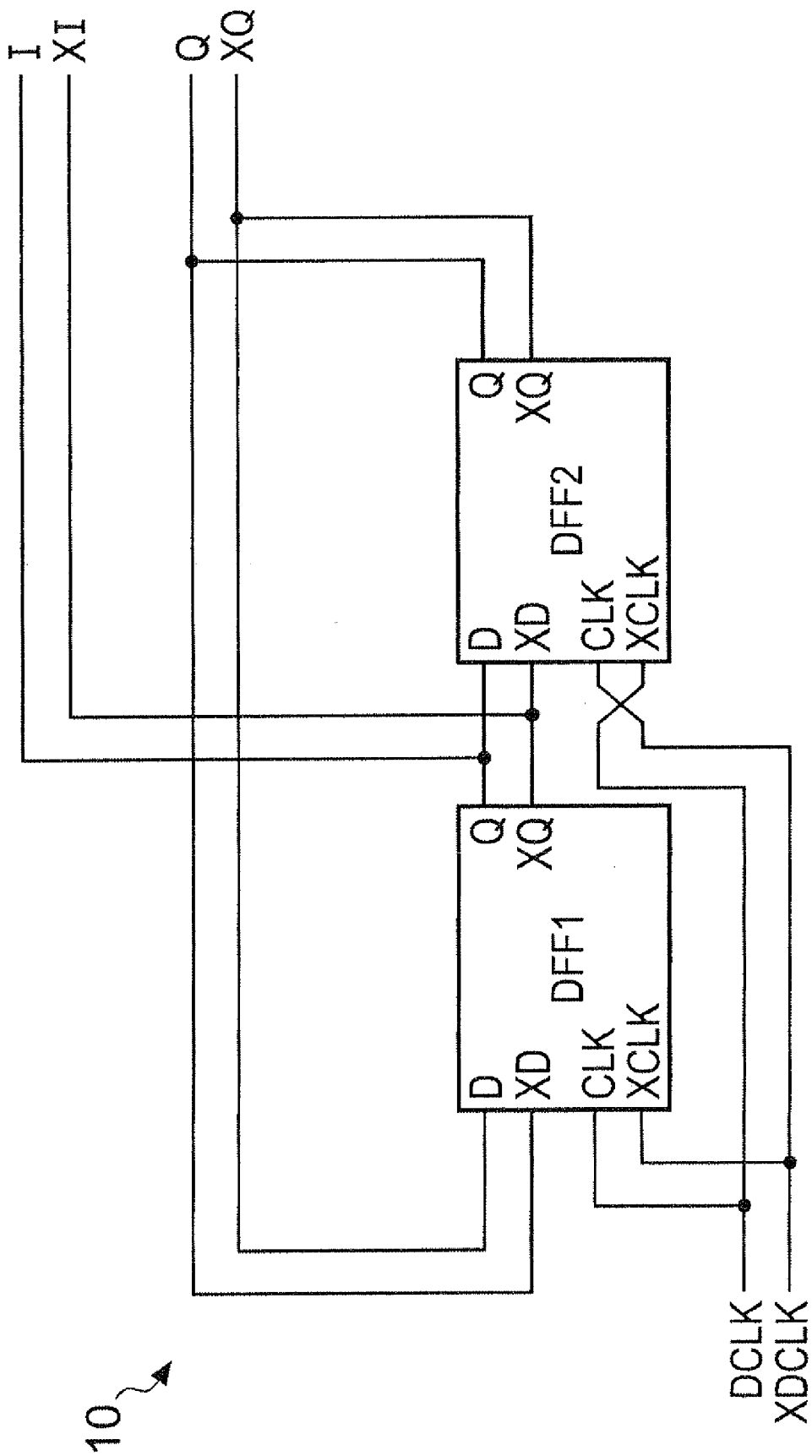
FIG. 1 is a schematic diagram of an IQ generator.
Figure 2:
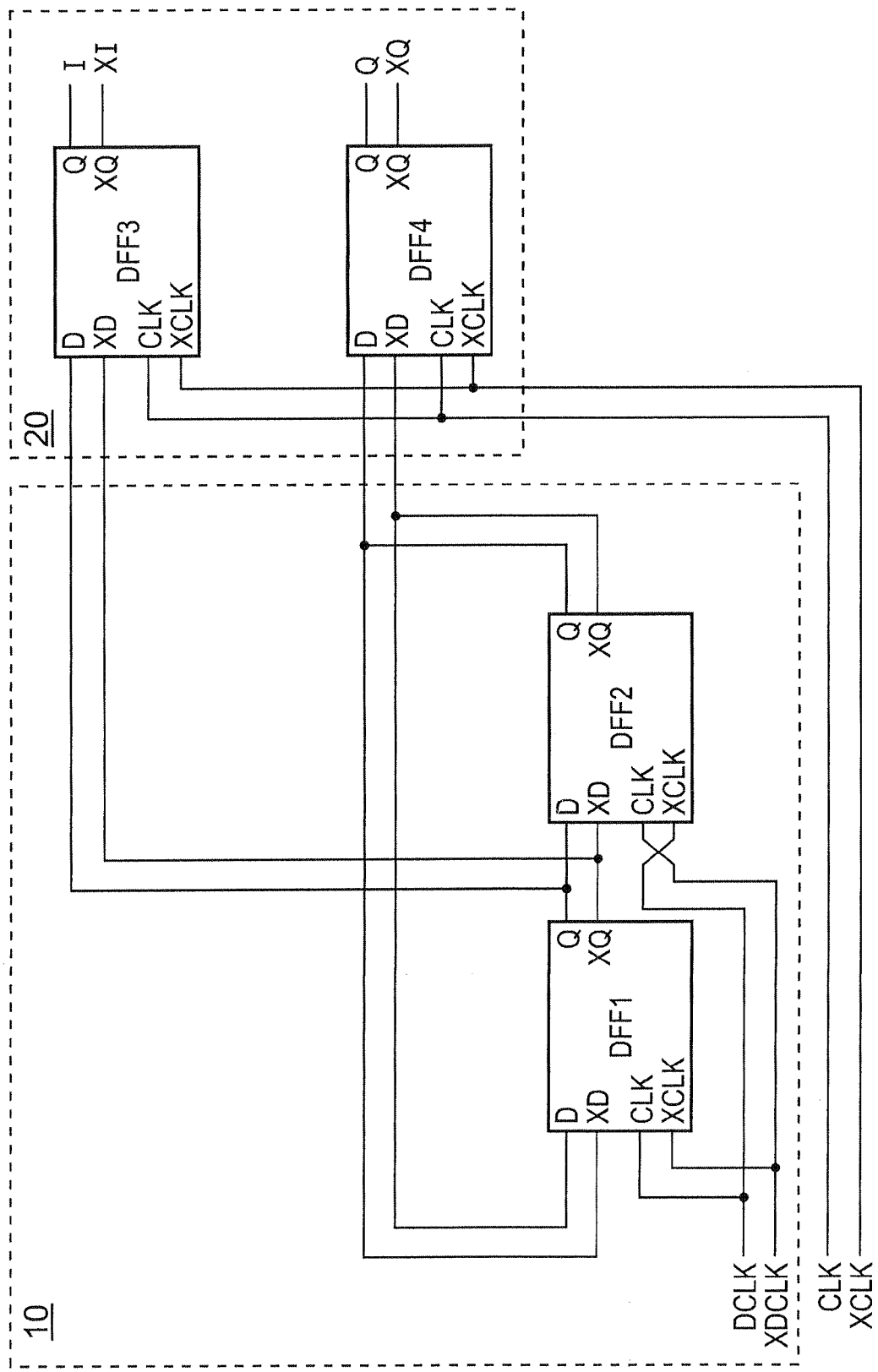
FIG. 2 is a schematic diagram showing the IQ generator of FIG. 1 connected to phase-error-reduction circuitry.

FIG. 2 shows the IQ generator 10 of FIG. 1 connected to phase-error-reduction circuitry 20.

The IQ generator 10 includes a master latch circuitry portion DFF1 and a slave latch circuitry portion DFF2. Although each of the master and slave latch circuitry portions DFF1 and DFF2 is shown in the form of a D-type flip-flop, it is to be understood that other types of latch circuitry may be used. An IQ generator clock signal DCLK is fed to a non-inverting clock input CLK of the master latch circuitry portion DFF1 and to an inverting clock input XCLK of the slave latch circuitry portion DFF2. A non-inverted output Q of the master latch circuitry portion DFF1 is fed to a non-inverting input D of the slave latch circuitry portion DFF2. An inverted output XQ of the slave latch circuitry portion DFF2 is fed back to a non-inverting input D of the master latch circuitry portion DFF1.

The phase-error-reduction circuitry 20 includes a first sampling circuitry portion DFF3 and a second sampling circuitry portion DFF4. In this embodiment, each of the first and second sampling circuitry portions DFF3 and DFF4 comprises a D-type flip-flop. A non-inverting input D of the first sampling circuitry portion DFF3 is arranged to receive an I input signal from the non-inverted output Q of the master latch circuitry portion DFF1 of the IQ generator 10. A non-inverting input D of the second sampling circuitry portion DFF4 is arranged to receive a Q input signal from the non-inverted output Q of the slave latch circuitry portion DFF2 of the IQ generator 10. A non-inverted output Q of the first sampling circuitry portion DFF3 produces an I output signal and a non-inverted output Q of the second sampling circuitry portion DFF4 produces a Q output signal. A sampling clock signal CLK is fed to the non-inverting clock input CLK of each of the first and second sampling circuitry portions DFF3 and DFF4. A frequency of the sampling clock signal CLK is at least two times, and is an integer multiple of, a frequency of the IQ generator clock signal DCLK. Each of the first and second sampling circuitry portions DFF3 DFF4 is arranged to sample the respective I and Q input signal on a rising edge of the sampling clock signal CLK.

In a variant, the frequency of the sampling clock signal CLK may be a non-integer multiple of the frequency of the IQ generator clock signal DCLK. For example, a fractional divider with a multi-modulus approach may be used.

In use, the IQ generator 10 produces the I and Q input signals for the phase-error-reduction circuitry 20. There may be a phase error between the I and Q input signals, such that the phase lag between the signals is not exactly 90°. By sampling the I and Q input signals, the phase-error-reduction circuitry 20 tends to reduce the phase error between the I and Q output signals.

Any phase error between the I output signal and the IQ generator clock signal DCLK or between the Q output signal and the IQ generator clock signal is not important.

Figure 3:
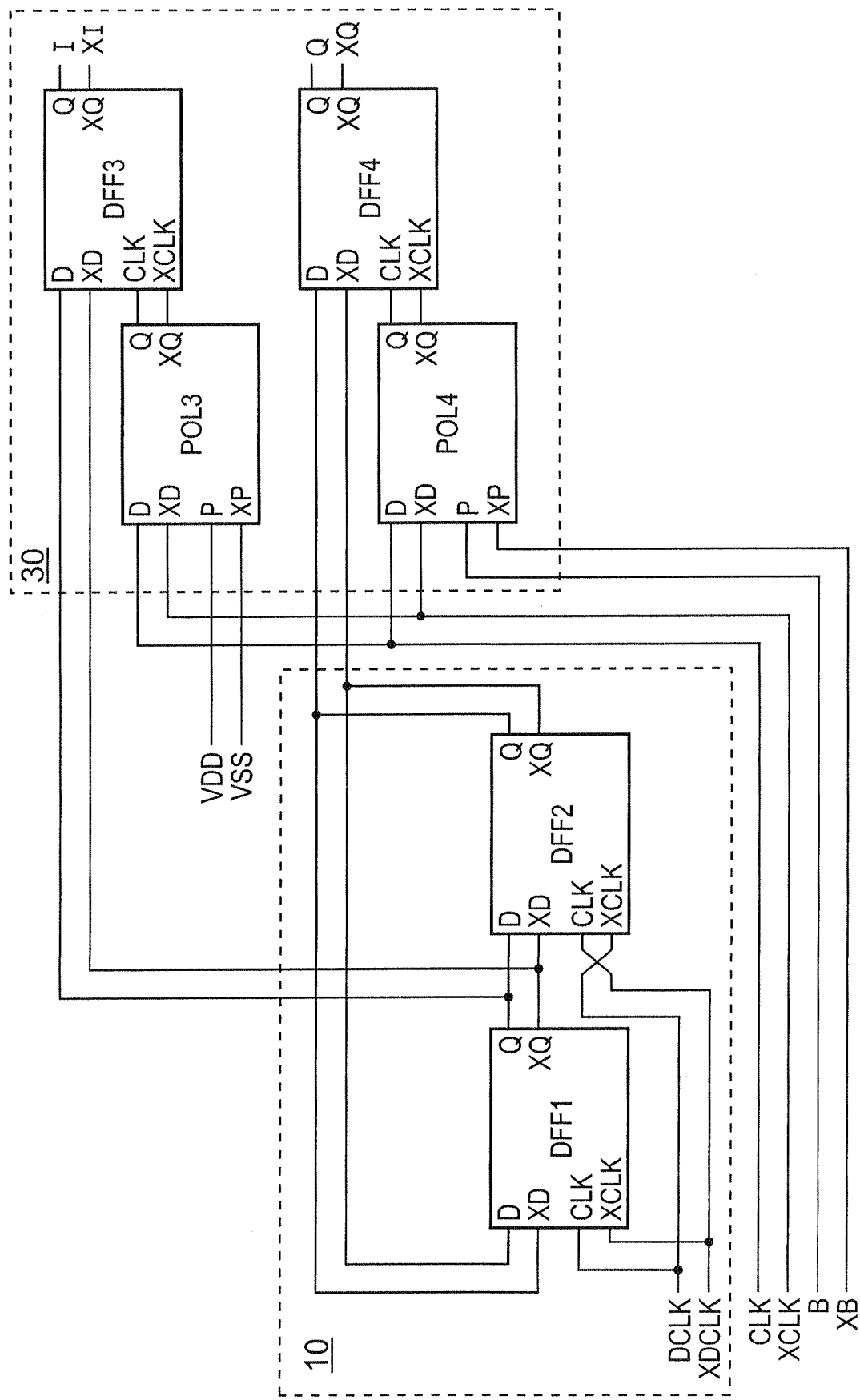
FIG. 3 is a schematic diagram showing the IQ generator of FIG. 1 connected to a variant of the phase-error-reduction circuitry of FIG. 2.

FIG. 3 shows the IQ generator 10 of FIG. 1 connected to phase-error-reduction circuitry 30, which is a variant of the phase-error-reduction circuitry 20 of FIG. 2.

The phase-error-reduction circuitry 30 includes first and second sampling circuitry portions DFF3 and DFF4, the purpose and function of which is identical to those of phase-error-reduction circuitry 20 shown in FIG. 2.

Phase-error-reduction circuitry 30 differs from phase-error-reduction circuitry 20 in that the sampling clock signal CLK is not fed directly to the non-inverting clock inputs CLK of the first and second sampling circuitry portions DFF3 and DFF4, but is passed via respective first and second polarity-control cells POL3 and POL4.

Figure 4:
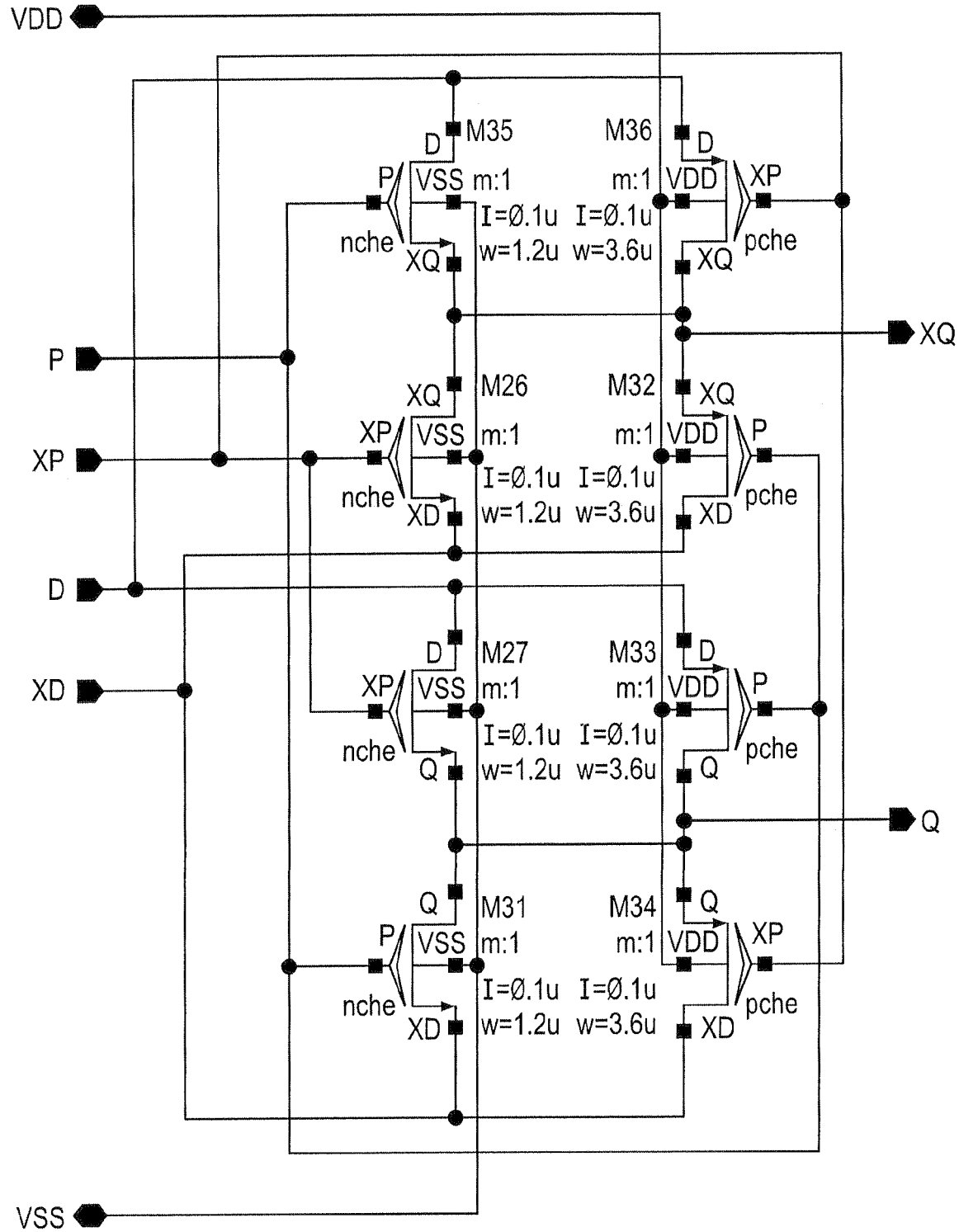
FIG. 4 is a schematic diagram of a polarity-control cell of the phase-error-reduction circuitry of FIG. 3.

In this embodiment, each of the first and second polarity-control cells POL3 and POL4 comprises a transmission gate. FIG. 4 is a detailed schematic diagram of the transmission gate. Depending on the control signal P/XP, either the non-inverting input D or the inverting input XD is connected respectively to the inverted output Q or the inverted output XQ.

Referring back to FIG. 3, the first polarity-control cell POL3 is arranged to receive the sampling clock signal CLK and has its non-inverted output Q connected to the non-inverting clock input CLK of the first sampling circuitry portion DFF3. The first polarity-control cell POL3 is arranged to feed an inverted version of the sampling clock signal CLK to the non-inverting clock input CLK of the first sampling circuitry portion DFF3. The first polarity-control cell POL3 serves to match a delay in the signal path that feeds the sampling clock signal CLK to the first sampling circuitry portion DFF3 with a delay in a signal path that feeds the sampling clock signal CLK to the second sampling circuitry portion DFF4. A non-inverting control input P of the first polarity-control cell POL3 is tied to VDD, and is therefore set to logic 1.

The second polarity-control cell POL4 is arranged to receive the sampling clock signal CLK and has its non-inverted output Q connected to a non-inverting clock input CLK of the second sampling circuitry portion DFF4. The second polarity-control cell DFF4 is arranged to feed an inverted or a non-inverted version of the sampling clock signal CLK to the non-inverting clock input CLK of the second sampling circuitry portion DFF4 according to a level of a sampling frequency selection signal, B. The second polarity-control cell POL4 is arranged to receive the sampling frequency selection signal B at its non-inverting control input P.

The arrangement allows the phase-error-reduction circuitry 30 to adjust a frequency at which the I and Q input signals are sampled in response to a level of the sampling frequency selection signal B. The phase-error-reduction circuitry 30 is arranged to sample the I and Q input signals at a frequency which is an even multiple of the IQ generator clock signal DCLK in response to the sampling frequency selection signal B being at a first level corresponding to logic 1 and to sample the I and Q input signals at a frequency which is an odd multiple of the IQ generator clock signal DCLK in response to the sampling frequency selection signal B being at a second level corresponding to logic 0.

The operation of the phase-error-reduction circuitry 30 will now be described with reference to the timing diagrams in FIGS. 5 and 6.

Figure 5:
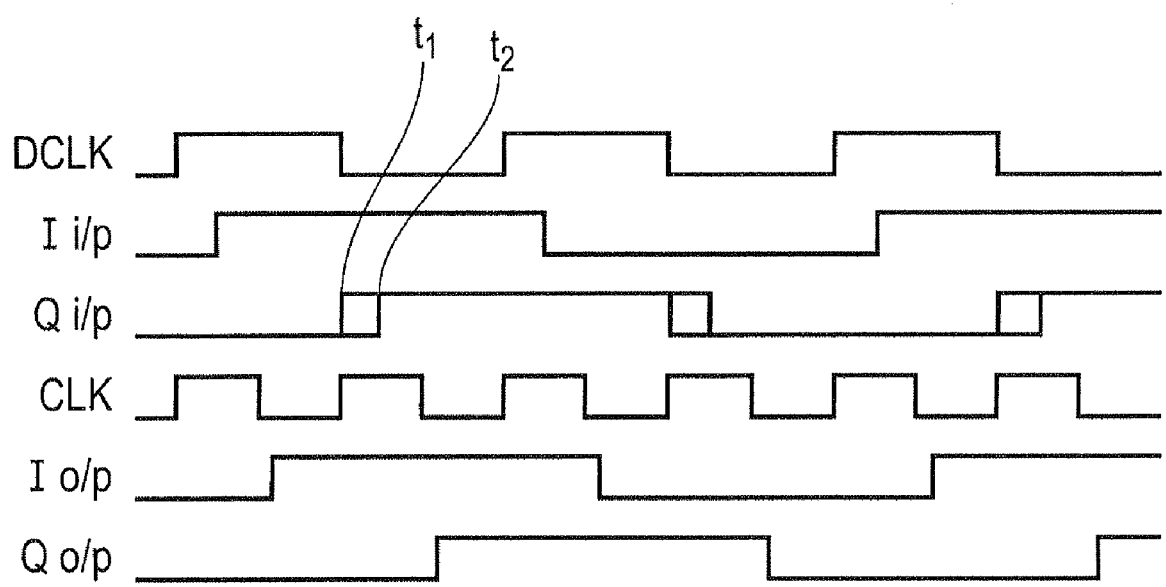
FIG. 5 is a timing diagram illustrating one mode of operation of the phase-error-reduction circuitry of FIG. 3.

FIG. 5 shows the IQ generator clock signal DCLK, the I input signal (I i/p), the Q input signal (Q i/p), the sampling clock signal CLK, the I output signal (I o/p) and the Q output signal (Q o/p). As the control input P of the first polarity control cell POL3 is tied to logic 1, the first sampling circuitry portion DFF3 samples on the falling edge of the sampling clock signal CLK. Setting B to logic 1 gives an even ratio between the sampling clock signal CLK and the IQ generator clock signal DCLK (in this configuration, the ratio is two). As a result of this setting, the second polarity-control cell POL4 inverts the sampling clock signal CLK. This means that the second sampling circuitry portion DFF4 also samples on the falling edge of the sampling clock signal CLK.

To illustrate the operation of the phase-error-reduction circuitry 30, the Q input signal in FIG. 5 has a phase difference to the I input signal which is less than 90°, with the Q input signal rising at time $t_1$ rather than at the correct time $t_2$. The timing diagram demonstrates that, by sampling the I and Q input signals (in this case on the falling edge of the sampling clock signal CLK), the phase error between the I and Q output signals is reduced.

Figure 6:
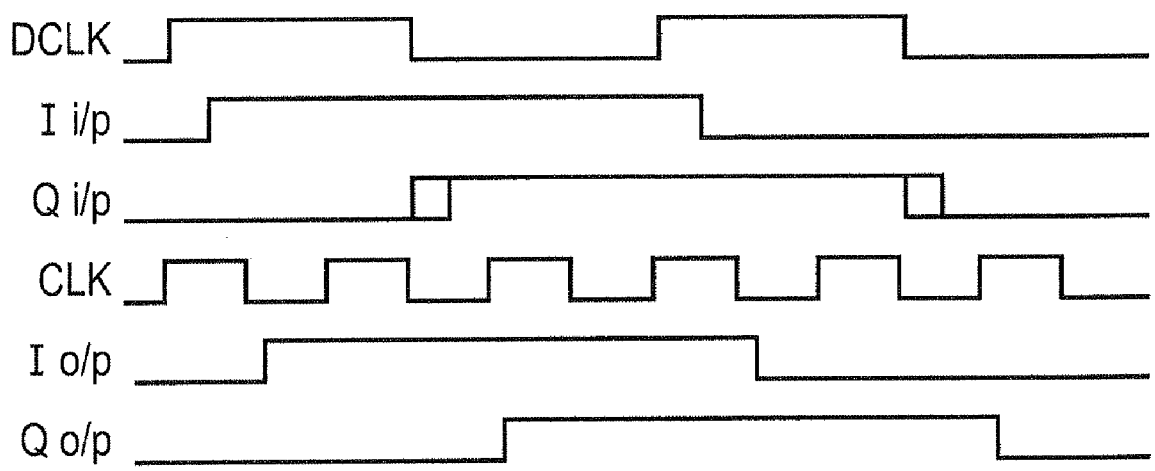
FIG. 6 is a timing diagram illustrating another mode of operation of the phase-error-reduction circuitry of FIG. 3.

FIG. 6 shows a similar example in which there is an odd ratio between the sampling clock signal CLK and the IQ generator clock signal DCLK (in this configuration, the ratio is three). In this case, B is set to logic 0, which means that DFF4 samples on a rising edge of the sampling clock signal CLK (while the first sampling circuitry portion DFF3 still samples on the falling edge of the sampling clock signal CLK). The phase error between the I and Q output signals is again reduced.

Figure 7:
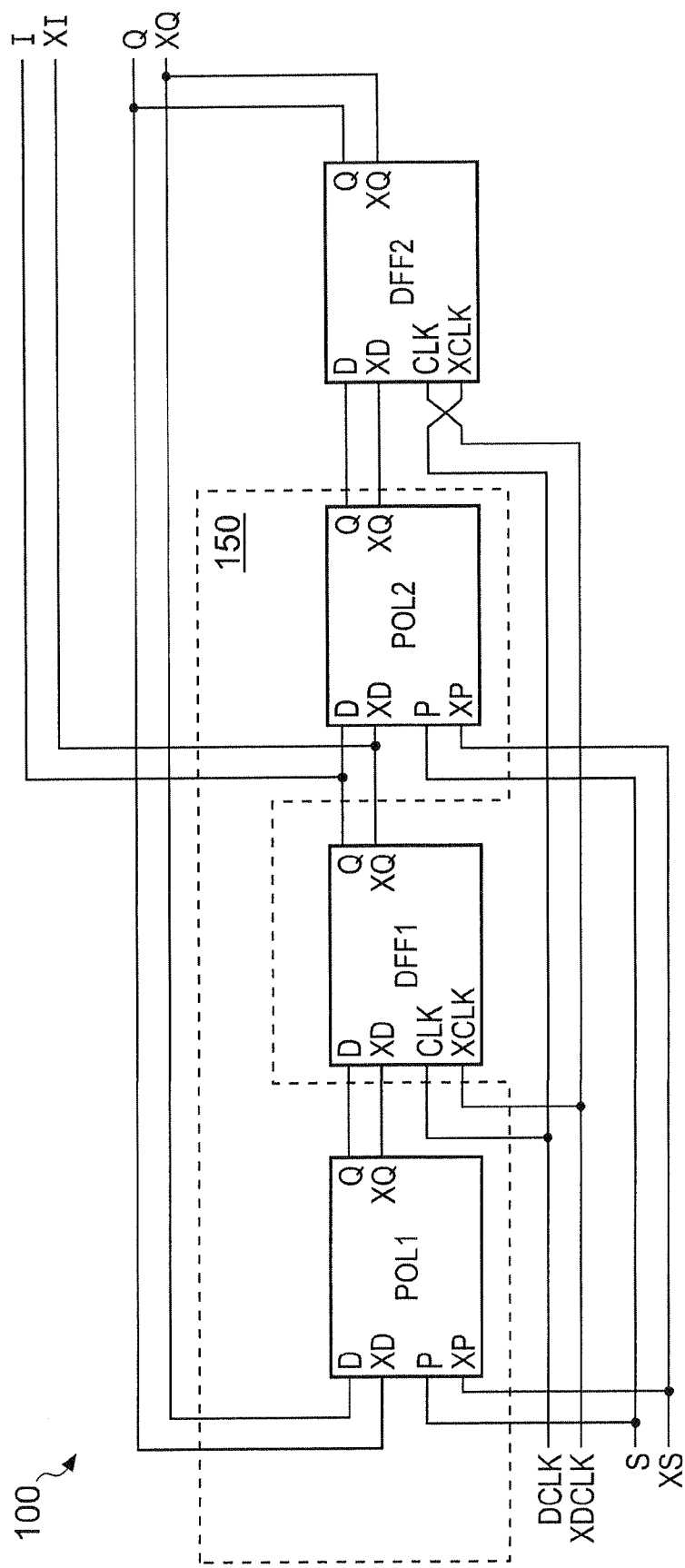
FIG. 7 is a schematic diagram of a phase-controlled IQ generator including phase control circuitry.

FIG. 7 shows a phase-controlled IQ generator 100 arranged to output I and Q signals. The phase-controlled IQ generator 100 is based on the IQ generator 10 shown in FIG. 1 and comprises phase control circuitry 150 arranged to switch the phase relationship of the I and Q signals between the I signal leading the Q signal and the I signal lagging the Q signal in response to a phase relationship selection signal S.

The phase control circuitry 150 comprises first and second polarity-control cells POL1 and POL2 arranged to output an inverted or a non-inverted version of their input signals according to a level of the phase relationship selection signal S. in this embodiment, the first and second polarity control cells POL1 and POL2 are transmission gates as shown in FIG. 4.

The phase-controlled IQ generator 100 comprises a master latch circuitry portion DFF1, a slave latch circuitry portion DFF2 and the first and second polarity-control cells POL1 and POL2. The master latch circuitry portion DFF1 is arranged to receive an IQ generator clock signal DCLK at its non-inverting clock input CLK and the slave latch circuitry portion DFF2 is arranged to receive the IQ generator clock signal DCLK at its inverting clock input XCLK. The master latch circuitry portion DFF1 is arranged to receive at a non-inverting input a signal from the inverted output of the slave latch circuitry portion DFF2 via the first polarity-control cell POL1. The slave latch circuitry portion DFF2 is arranged to receive at a non-inverting input a signal from the non-inverted output of the master latch circuitry portion DFF1 via the second polarity-control cell POL2.

The operation of the phase-controlled IQ generator 100 will now be described with reference to the timing diagrams in FIGS. 8 and 9.

The purpose of the polarity-control cells POL1 and POL2 is to invert the input signals of the master and slave latch circuitry DFF1 and DFF2. The master latch circuitry portion DFF1 latches on the rising edge of the IQ generator clock signal DCLK and the slave latch circuitry portion DFF2 samples on the falling edge of the IQ generator clock signal DCLK. As the inverted output XQ of the slave latch circuitry portion DFF2 is connected to the non-inverting input D of the first polarity-control cell POL1, the signal is inverted.

Figure 8:
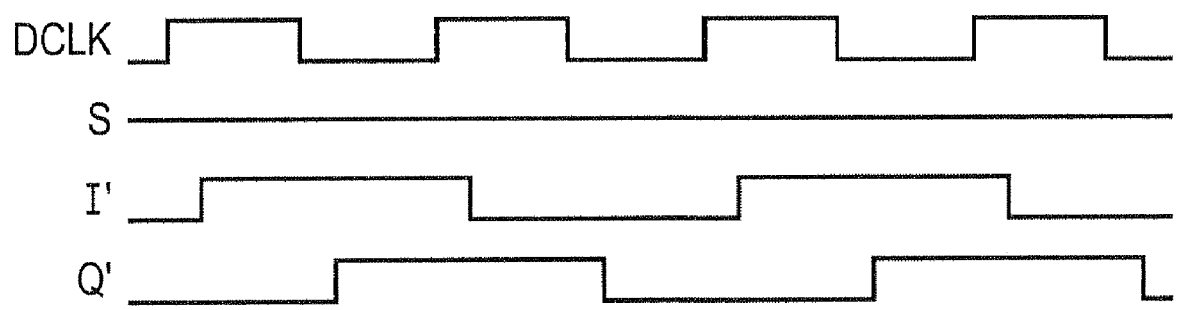
FIG. 8 is a timing diagram illustrating one mode of operation of the phase-controlled IQ generator of FIG. 7.

FIG. 8 shows the case in which the phase relationship selection signal S is at logic 0. In this case, the polarity-control cells POL1 and POL2 do not invert the signal. It can be seen that the Q signal is initially logic 0. The non-inverting input D of the master latch circuitry portion DFF1 receives the inverted output XQ of the slave latch circuitry portion DFF2, and therefore receives a signal at logic 1. With the next rising edge of the IQ generator clock signal DCLK, the I signal will be at logic 1. The following falling edge of the IQ generator clock signal DCLK sets the Q signal to logic 1, and so on. This means the I signal is in front of the Q signal.

Figure 9:
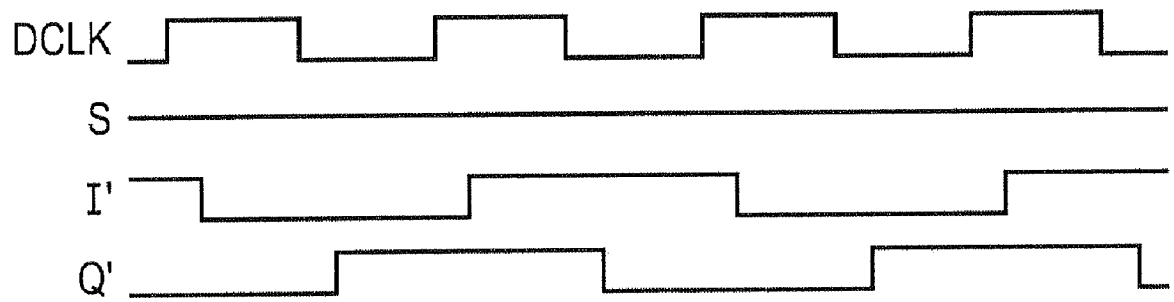
FIG. 9 is a timing diagram illustrating another mode of operation of the phase-controlled IQ generator of FIG. 7.

FIG. 9 shows the case in which the phase relationship selection signal S is at logic 1. In this case, both polarity-control cells POL1 and POL2 invert their signals. The signal from the inverted output XQ of the slave latch circuitry portion DFF2 is inverted by the first polarity-control cell POL1, which has the same effect as if the master slave latch circuitry portion DFF1 received a signal from the non-inverted output of the slave latch circuitry portion DFF2, i.e. the Q signal.

Assuming that, in earlier states, the Q signal was logic 1 and is now logic 0, when the master latch circuitry portion DFF1 latches on the rising edge of the IQ generator clock signal DCLK, the I signal will change to logic 0. The following falling edge of the IQ generator clock signal DCLK sets the Q signal to logic 1 as the slave latch circuitry portion DFF2 latches an inverted version of the I signal (inverted by the second polarity-control cell POL2). With the next rising edge of the IQ generator clock signal DCLK, the master latch circuitry portion DFF1 latches the Q signal, which is at logic 1. The I signal will be therefore also be logic 1. This means the I signal is behind the Q signal.

Figure 10:
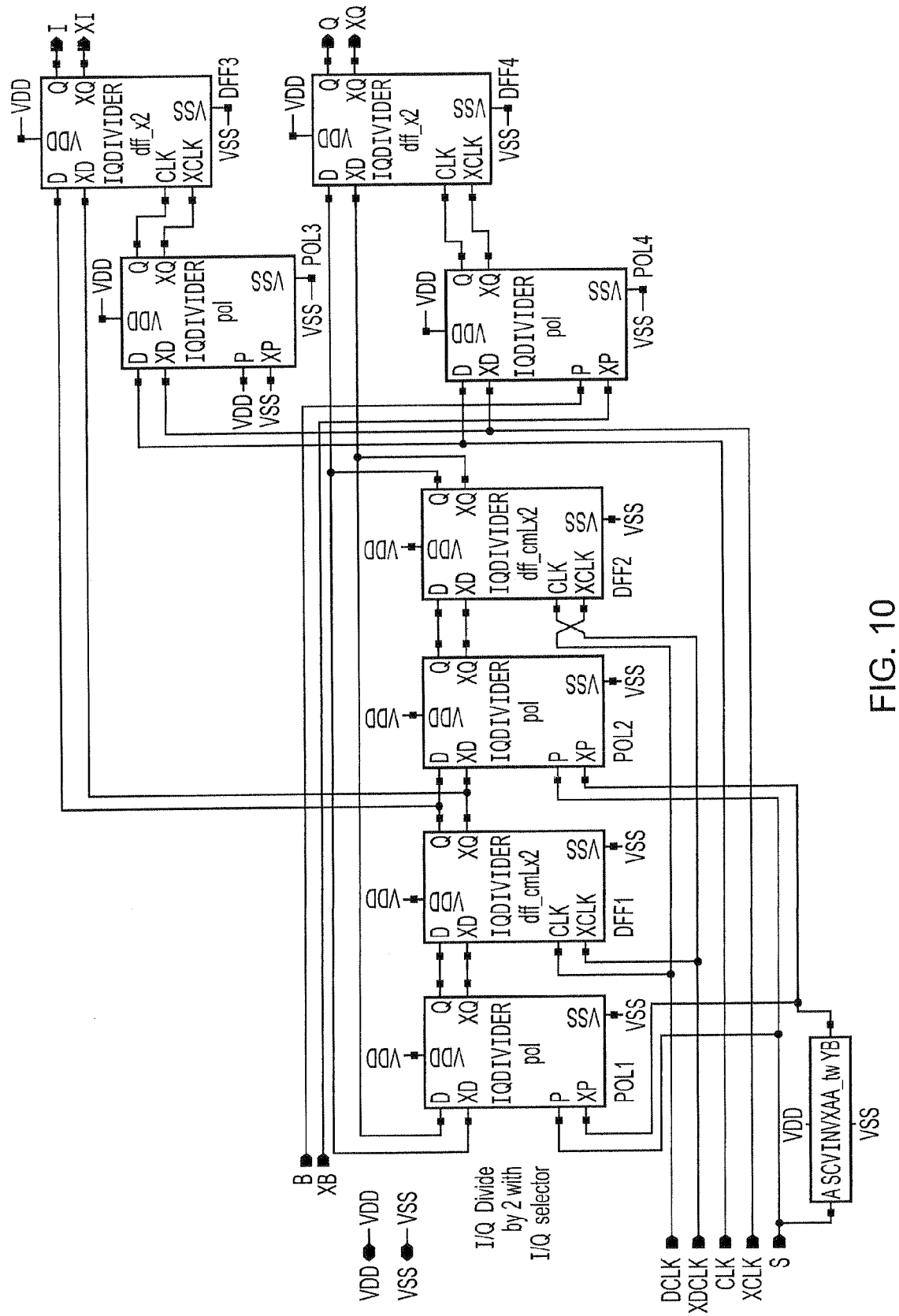
FIG. 10 is a schematic diagram of an IQ generator including the phase control circuitry of FIG. 7 and being connected to the phase-error-reduction circuitry of FIG. 3.

FIG. 10 shows an IQ generator 200 including the phase control circuitry 150 of FIG. 7 and being connected to the phase-error-reduction circuitry 30 of FIG. 3. The operation of the phase control circuitry 150 and the phase-error-reduction circuitry 30 is as described above.

Figure 11:
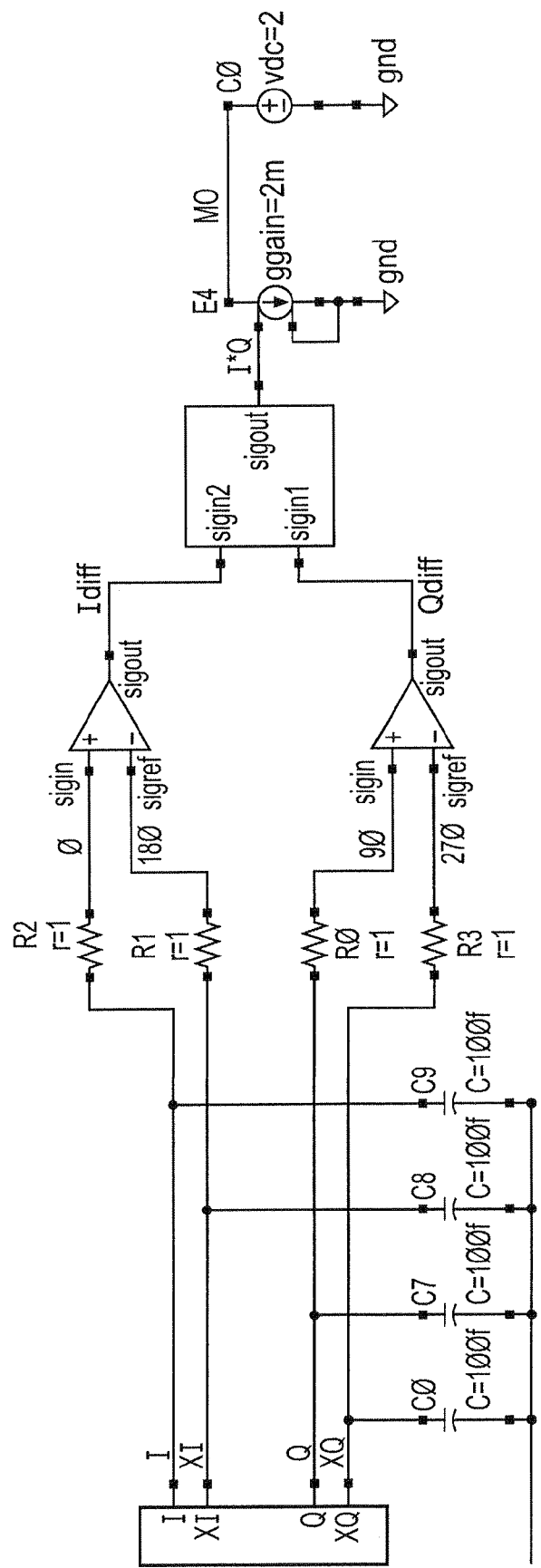
FIG. 11 is a schematic diagram of evaluation circuitry suitable for evaluating the phase error of an IQ generator.

FIG. 11 is a schematic diagram of evaluation circuitry suitable for evaluating the phase error of an IQ generator.

The outputs of the IQ generator are connected over ideal comparators to an ideal mixer. The output voltage of the mixer will be converted to current using a voltage controlled current source connected over a DC source to ground. The magnitude of the generated current gives the relative phase error.

In order to have a reference value for the phase error both inputs of the mixer have to be connected to the same comparator output i.e. Idiff. This corresponds to a phase error of 90°. The magnitude of the generated current can be used as reference. The formula to calculate the phase error can be expressed as:—

$$PhErr = \frac{90 \text{ deg} * Inom}{Iref}$$

FIGS. 12 to 15 are graphs showing the results of simulations of the IQ generator of FIG. 10 in various configurations.

Figure 12:
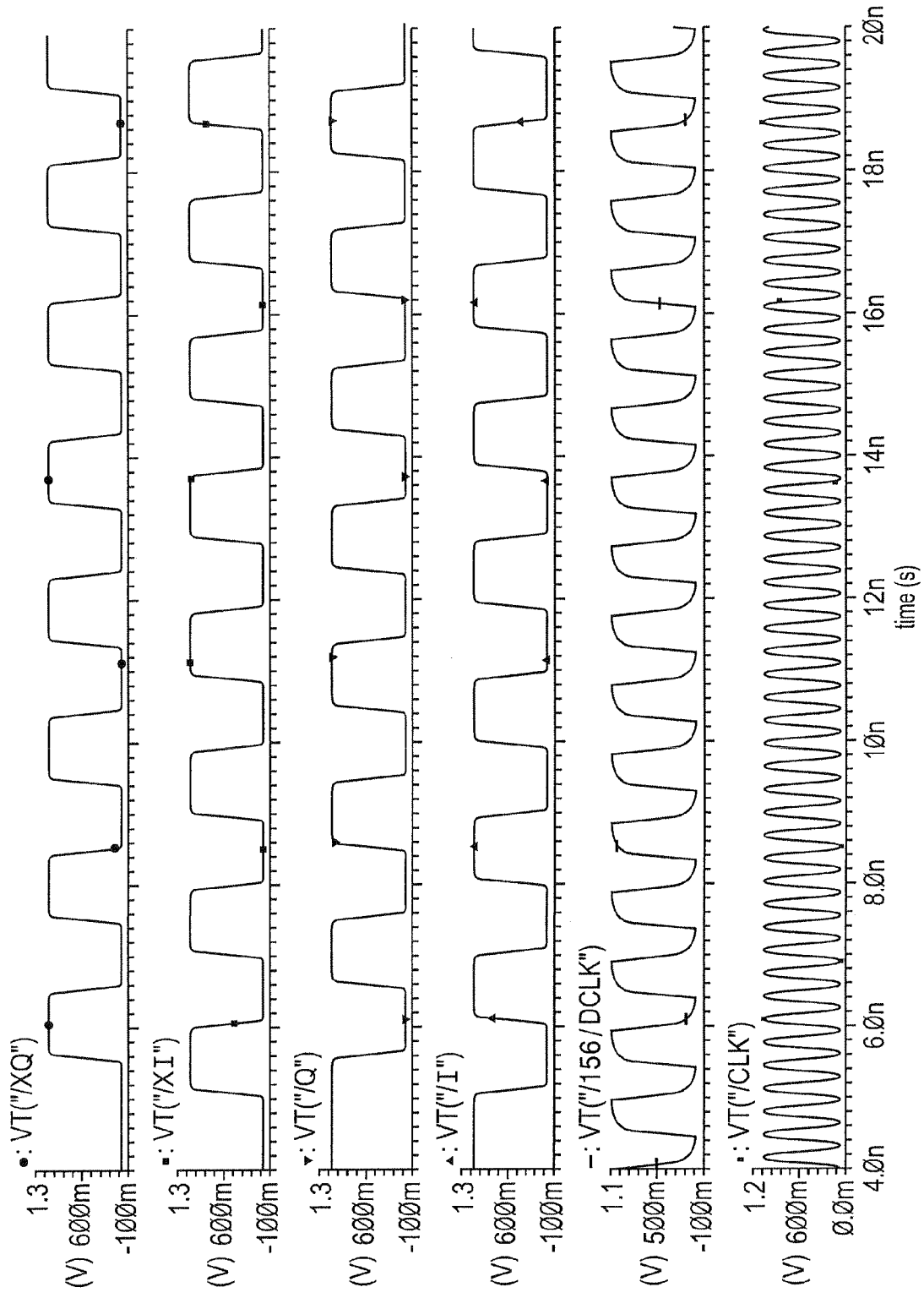
FIG. 12 is a graph showing the results of a simulation of the IQ generator of FIG. 10 in one configuration.

FIG. 12 shows the results for a configuration in which both the sampling frequency selection signal and the phase relationship selection signal are at logic 0.

Figure 13:
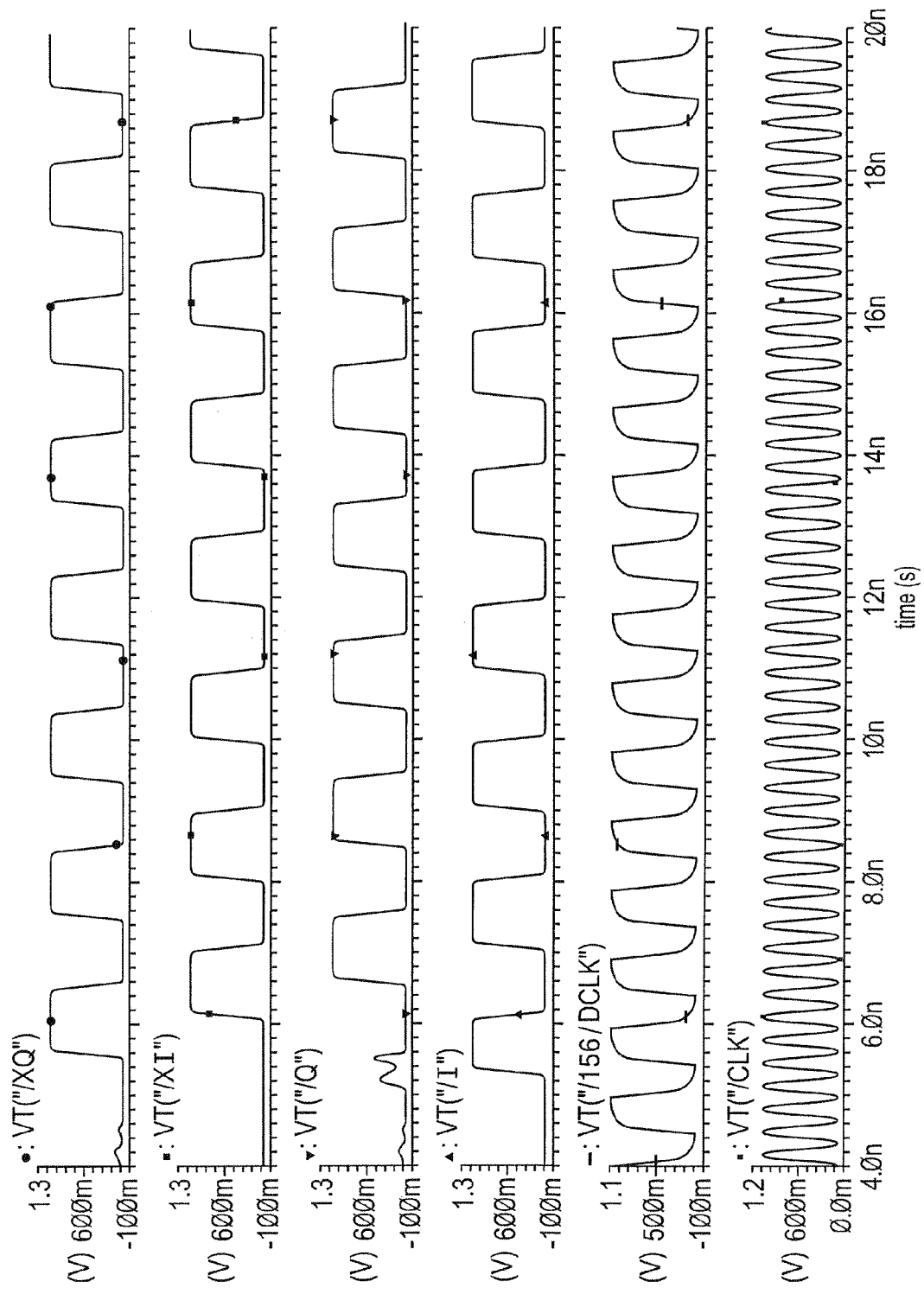
FIG. 13 is a graph showing the results of a simulation of the IQ generator of FIG. 10 in another configuration.

FIG. 13 shows the results for a configuration in which the sampling frequency selection signal is at logic 1 and the phase relationship selection signal is at logic 0.

Figure 14:
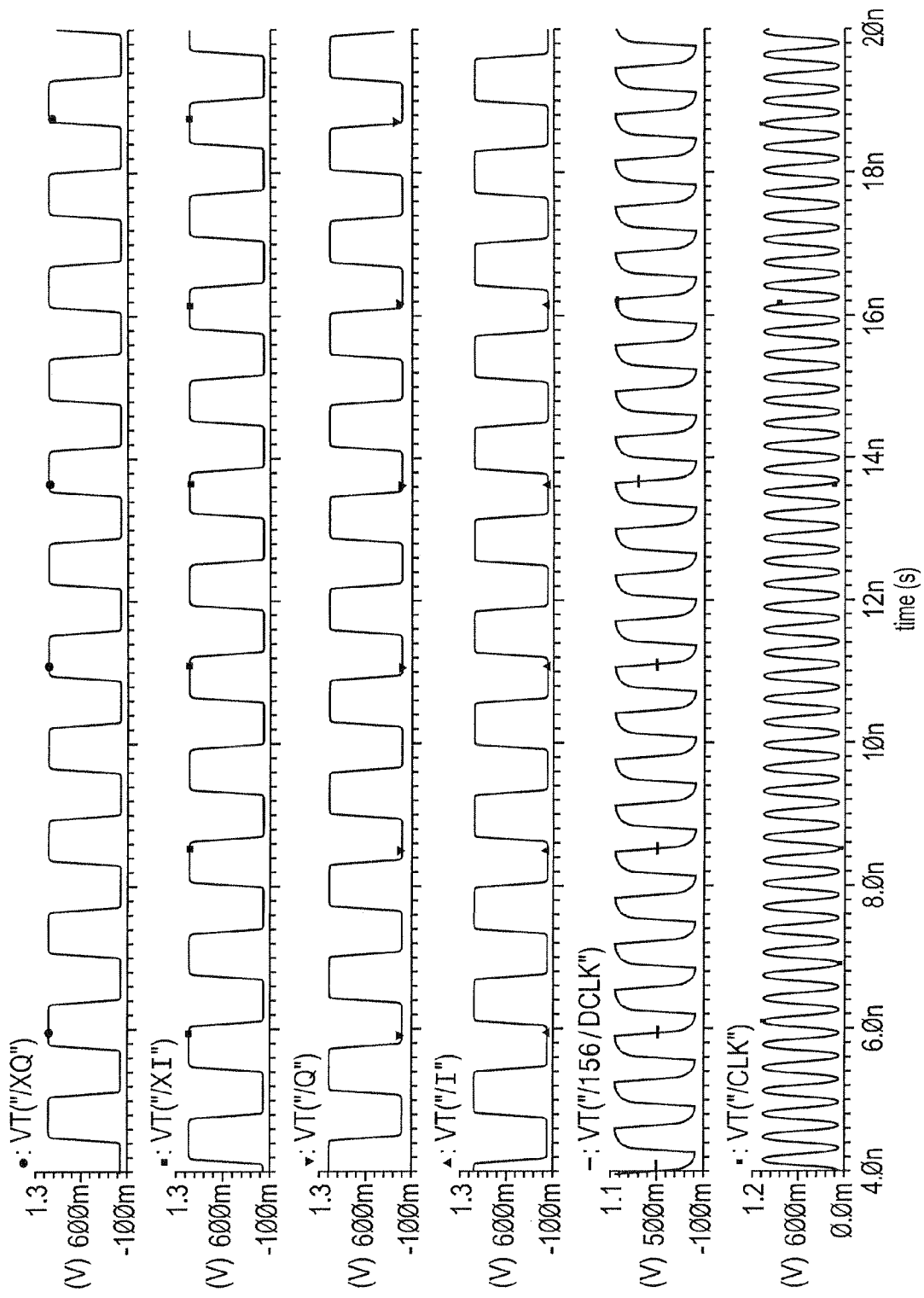
FIG. 14 is a graph showing the results of a simulation of the IQ generator of FIG. 10 in another configuration.

FIG. 14 shows the results for a configuration in which the sampling frequency selection signal is at logic 0 and the phase relationship selection signal is at logic 1.

Figure 15:
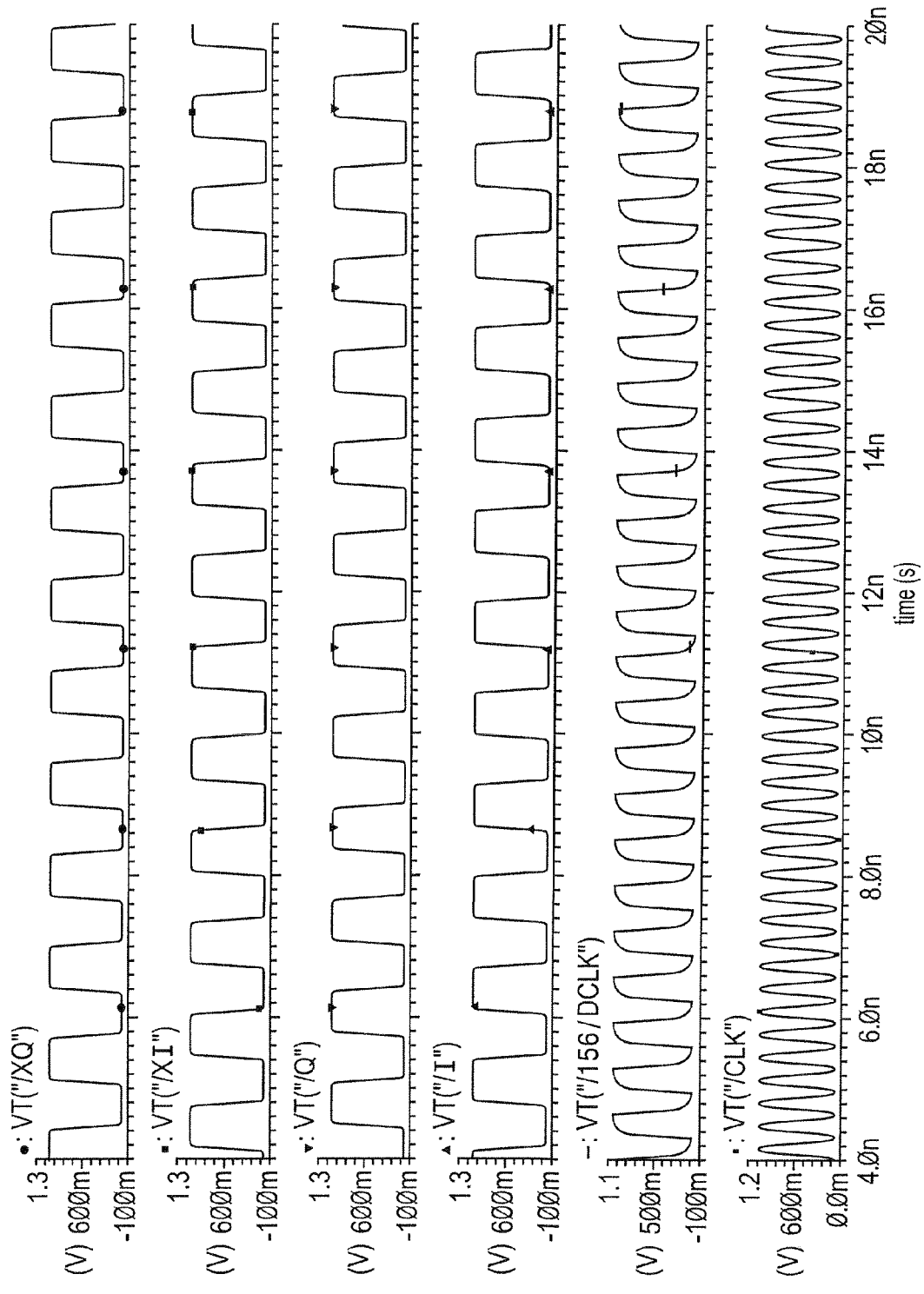
FIG. 15 is a graph showing the results of a simulation of the IQ generator of FIG. 10 in another configuration.

FIG. 15 shows the results for a configuration in which both the sampling frequency selection signal and the phase relationship selection signal are at logic 1.

Table 1 below indicates the settings used in the simulations and their significance.

TABLE 1

| S | Description | B | Description |
|---|---|---|---|
| 0 | I 90 deg in front of Q | 0 | odd ratio between CLK and DCLK |
| 1 | I 90 deg behind Q | 1 | even ratio between CLK and DCLK |

Figure 16:
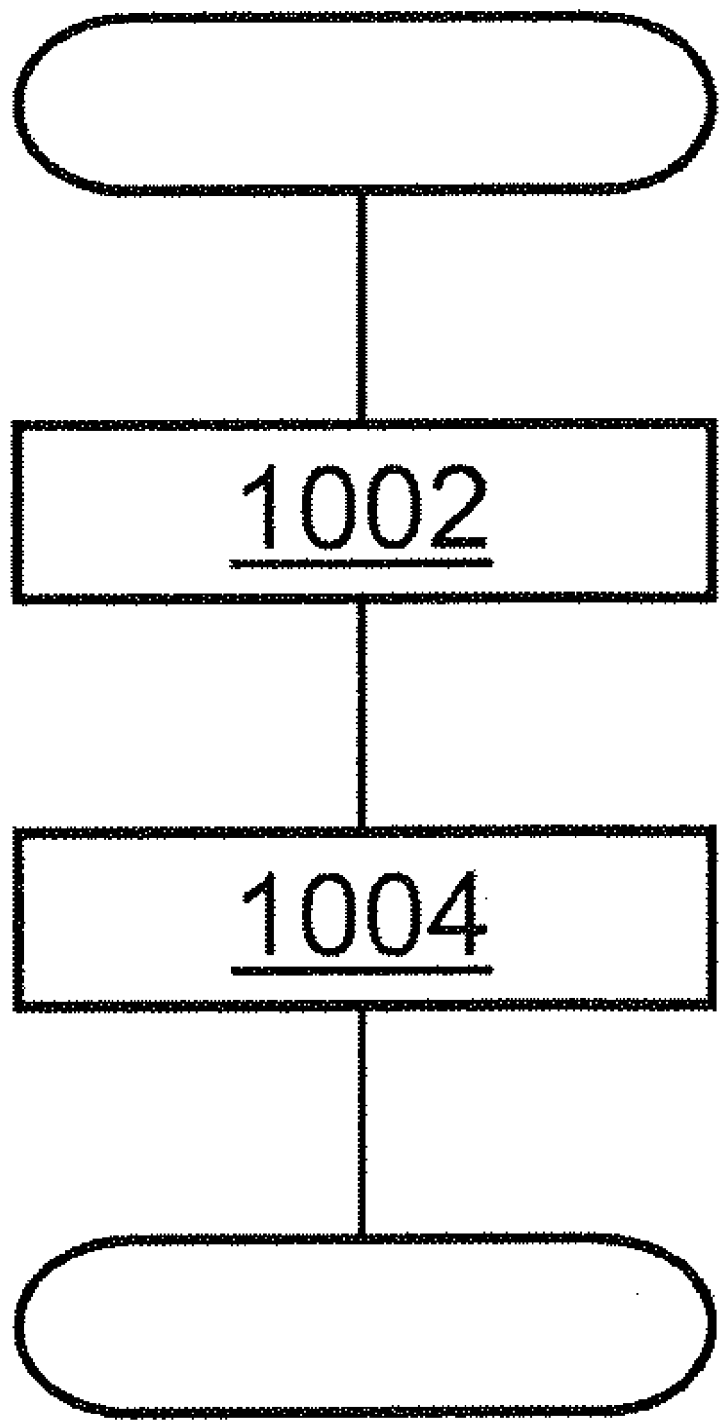
FIG. 16 is a flowchart representing a method of reducing a phase error between I and Q signals from an IQ generator.

FIG. 16 is a flowchart representing a method of reducing a phase error between I and Q signals from an IQ generator. The method comprises receiving (1002) I and Q input signals from the IQ generator and producing (1004) I and Q output signals, and wherein producing the I and Q output signals comprises sampling the I and Q input signals to tend to reduce a phase error between the I and Q output signals.

Figure 17:
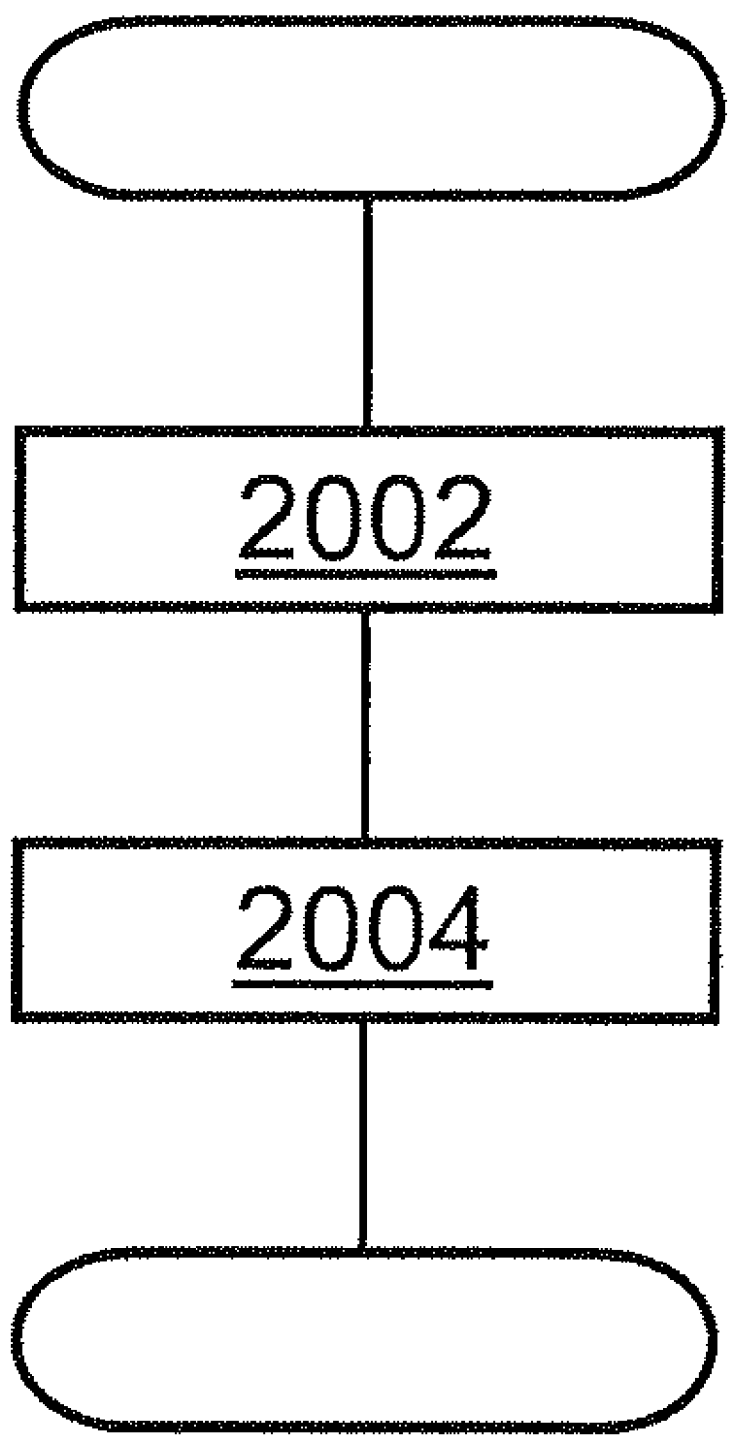
FIG. 17 is a flowchart representing a method of operating a phase-controlled IQ generator.

FIG. 17 is a flowchart representing a method of operating a phase-controlled IQ generator comprising outputting (2002) I and Q signals and switching (2004) the phase relationship of the I and Q signals between the I signal leading the Q signal and the I signal lagging the Q signal in response to a phase relationship selection signal.

Although the above embodiments have been described using D-type flip-flops at the sampling/latch circuitry portions, it will be understood that other forms of sampling/latch circuitry may be used instead. For example, in one variant, a JK flip-flop configured as a D-type flip-flop may be used.

It will be appreciated that the aforementioned circuitry may have other functions in addition to the mentioned functions, and that these functions may be performed by the same circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. Phase-error-reduction circuitry (20;30) for an IQ generator (10; 100; 200), wherein the phase-error-reduction circuitry is arranged to receive I and Q input signals from the IQ generator and to produce I and Q output signals, and wherein the phase-error-reduction circuitry is arranged to sample the I and Q input signals to tend to reduce a phase error between the I and Q output signals.

2. The phase-error-reduction circuitry of claim 1 comprising first and second sampling circuitry portions (DFF3, DFF4) arranged to receive the respective I and Q input signals and to produce the respective I and Q output signals, wherein the first and second sampling circuitry portions are arranged to sample the respective I and Q input signals according to a sampling clock signal (CLK), the sampling clock signal being independent of an IQ generator clock signal (DCLK) of the IQ generator (10; 100; 200).

3. The phase-error-reduction circuitry of claim 1 arranged to adjust a frequency at which the I and Q input signals are sampled in response to a level of a sampling frequency selection signal (B).

4. The phase-error-reduction circuitry of claim 3 arranged to sample the I and Q input signals at a frequency which is an even multiple of an IQ generator clock signal (DCLK) in response to the sampling frequency selection signal (B) being at a first level and to sample the I and Q input signals at a frequency which is an odd multiple of the IQ generator clock signal in response to the sampling frequency selection signal being at a second level.

5. The phase-error-reduction circuitry of claim 2 comprising a polarity-control cell (POL0) arranged to receive the sampling clock signal (CLK) and having its output connected to a clock input of one of the first and second sampling circuitry portions (DFF3, DFF4), the polarity-control cell being arranged to feed an inverted or a non-inverted version of the sampling clock signal to the clock input of the respective sampling circuitry portion according to a level of a sampling frequency selection signal (B).

6. The phase-error-reduction circuitry of claim 5 comprising a further polarity-control cell (POL3) arranged to receive the sampling clock signal (CLK) and having its output connected to a clock input of the other of the first and second sampling circuitry portions (DFF3, DFF4), the further polarity-control cell being arranged to feed an inverted version of the sampling clock signal to the clock input of the respective sampling circuitry portion.

7. The phase-error-reduction circuitry of claim 2 wherein the first and second sampling circuitry portions (DFF3, DFF4) are arranged to sample the I and Q input signals on one of a rising edge and a falling edge of the sampling clock signal (CLK).

8. The phase-error-reduction circuitry of claim 2 wherein one of the first and second sampling circuitry portions (DFF3, DFF4) is arranged to sample the respective I or Q input signal on a rising edge of the sampling clock signal (CLK) and the other of the first and second sampling circuitry portions is arranged to sample the respective I or Q input signal on a falling edge of the sampling clock signal.

9. The phase-error-reduction circuitry of claim 1 wherein a frequency of a sampling clock signal (CLK) is at least four times higher than a frequency of the I and Q output signals.

10. A phase-controlled IQ generator (100; 200) arranged to output I and Q signals and comprising phase control circuitry (150) arranged to switch the phase relationship of the I and Q signals between the I signal leading the Q signal and the I signal lagging the Q signal in response to a phase relationship selection signal (S).

11. The phase-controlled IQ generator of claim 10 wherein the phase control circuitry (150) comprises at least one polarity-control cell (POL1, POL2) arranged to output an inverted or a non-inverted version of its input signal according to a level of the phase relationship selection signal (S).

12. The phase-controlled IQ generator of claim 10 or 11 comprising a master latch circuitry portion (DFF1) and a slave latch circuitry portion (DFF2), wherein the phase control circuitry (150) is arranged to invert or not to invert inputs to the master and slave latch circuitry portions according to a level of the phase relationship selection signal (S).

13. The phase-controlled IQ generator of claim 10 comprising a master latch circuitry portion (DFF1), a slave latch circuitry portion (DFF2) and first and second polarity-control cells (POL1, POL2), the master latch circuitry portion being arranged to receive an IQ generator clock signal (DCLK) at its non-inverting clock input and the slave latch circuitry portion being arranged to receive the IQ generator clock signal at its inverting clock input, the master latch circuitry portion being arranged to receive at a non-inverting input a signal from the inverted output of the slave latch circuitry portion via the first polarity-control cell, and the slave latch circuitry portion being arranged to receive at a non-inverting input a signal from the non-inverted output of the master latch circuitry portion via the second polarity-control cell, wherein each of the first and second polarity control cells is arranged to receive the phase relationship selection signal (S) and to output an inverted or a non-inverted version of its input signal according to a level of the phase relationship selection signal.

14. The phase-controlled IQ generator (100; 200) of claim 10 connected to a phase-error-reduction circuitry (20; 30) arranged to receive I and Q input signals from the IQ generator and to produce I and Q output signals, and wherein the phase-error-reduction circuitry is arranged to sample the I and Q input signals to tend to reduce a phase error between the I and Q output signals such that the I and Q signals output by the phase-controlled IQ generator are received by the phase-error-reduction circuitry as the I and Q input signals.

15. The phase-error-reduction circuitry (20; 30) of claim 1 wherein the IQ generator comprises a phase-controlled IQ generator (150) arranged to output I and Q signals and comprising phase control circuitry (150) arranged to switch the phase relationship of the I and Q signals between the I signal leading the Q signal and the I signal lagging the Q signal in response to a phase relationship selection signal (S).

16. A phase-controlled IQ generator (100; 200) arranged to output I and Q signals and comprising phase control circuitry (150) arranged to switch the phase relationship of the I and Q signals between the I signal leading the Q signal and the I signal lagging the Q signal in response to a phase relationship selection signal (S), wherein the phase-controlled IQ generator is connected to phase-error-reduction circuitry (20; 30) arranged to receive the I and Q signals from the phase-controlled IQ generator as I and Q input signals and to produce I and Q output signals, and wherein the phase-error-reduction circuitry is arranged to sample the I and Q input signals to tend to reduce a phase error between the I and Q output signals.

17. A method of reducing a phase error between I and Q signals from an IQ generator (10; 100; 200), the method comprising receiving I and Q input signals from the IQ generator and producing I and Q output signals, and wherein producing the I and Q output signals comprises sampling the I and Q input signals to tend to reduce a phase error between the I and Q output signals.

18. A method of operating a phase-controlled IQ generator (100; 200) comprising outputting I and Q signals and switching the phase relationship of the I and Q signals between the I signal leading the Q signal and the I signal lagging the Q signal in response to a phase relationship selection signal (S).

* * * * *